Sept. 20, 1966 J. L. HUTSON 3,274,463

SYMMETRICALLY SWITCHING INTEGRATED SEMICONDUCTOR DEVICES

Filed Feb. 11, 1964 5 Sheets-Sheet 1

INVENTOR.
JEARLD L. HUTSON
BY Robert C. Peterson
ATTORNEY

INVENTOR.
JEARLD L. HUTSON
BY Robert C. Peterson
ATTORNEY

SYMMETRICALLY SWITCHING INTEGRATED SEMICONDUCTOR DEVICES

Filed Feb. 11, 1964 5 Sheets-Sheet 3

INVENTOR.
JEARLD L. HUTSON
BY Robert C. Peterson
ATTORNEY

Sept. 20, 1966 J. L. HUTSON 3,274,463

SYMMETRICALLY SWITCHING INTEGRATED SEMICONDUCTOR DEVICES

Filed Feb. 11, 1964 5 Sheets-Sheet 4

INVENTOR.
JEARLD L. HUTSON
BY Robert C. Peterson

ATTORNEY

Sept. 20, 1966 J. L. HUTSON 3,274,463

SYMMETRICALLY SWITCHING INTEGRATED SEMICONDUCTOR DEVICES

Filed Feb. 11, 1964 5 Sheets-Sheet 5

INVENTOR.
JEARLD L. HUTSON
BY Robert C Peterson
ATTORNEY

United States Patent Office 3,274,463

Patented Sept. 20, 1966

3,274,463

SYMMETRICALLY SWITCHING INTEGRATED SEMICONDUCTOR DEVICES

Jearld L. Hutson, Richardson, Tex., assignor to Electronic Control Corporation, Dallas, Tex., a corporation of Texas Filed Feb. 11, 1964, Ser. No. 343,987
29 Claims. (Cl. 317—235)

This invention relates to semiconductor devices and circuits utilizing such devices, and more particularly, the invention relates to symmetrical semiconductor integrated circuits, and more specifically to semiconductor devices adapted to conventional as well as integrated circuits. In more detail the invention relates to slow switching silicon control rectifiers and symmetrical semiconductor devices, one referred to often hereinafter as a duojunction transistor and another as a duojunction controlled switch (DJCS), and power control circuits utilizing such devices in both conventional circuits and semiconductor integrated circuits.

Since the advent of power control circuits utilizing semiconductor devices such as silicon control rectifiers, silicon control switches and the like, it has become highly desirable and in many cases extremely essential to achieve precise timing circuits for exact sequencing the operation of such devices. In general, silicon controlled rectifiers and switches are switched from a high impedance to a low impedance between the anode and cathode by the application of a firing potential at a gate input. Such devices are well adapted for A.C. power control circuits which afford controls to such things as light dimmers, power drills, electric mixers, etc. Many power control circuits have been designed utilizing these devices for both half wave and full wave operation. For either type of operation it is essential that the devices switch from the high impedance to low impedance state in a precise timing sequence to produce the desired results. Of course, the full wave operation power control circuits using SCR's are designed to fire one SCR during the positive half cycle and another SCR during the negative half cycle. The development of unijunction transistor is one of the first advances in achieving exact timing circuits for providing sequential firing potential signals at the gate input to such SCR's.

Essentially, a unijunction transistor is made from a semiconductor bar, usually N-type silicon, with a pair of ohmic contacts referred to as base 1 and base 2 at opposite ends of the bar. The silicon bar has a uniform resistance referred to as the interbase resistance, $R_{bb}$, ranging from 5K to 10K ohms, typically. The unijunction transistor has what is referred to as a PN emitter junction which is usually formed relatively close to base 2. The base 1 is grounded and positive bias voltage, $V_{bb}$ is applied at base 2. In essence, when no emitter current is flowing or the emitter circuit is open, the silicon bar acts like a simple voltage divider and a certain fraction ISR or $\eta$ of $V_{bb}$ will appear at the emitter. This fraction, ISR is referred to as the intrinsic standoff ratio. If the emitter voltage $V_e$, is less than the fraction ISR of $V_{bb}$, the emitter will be reverse biased and only a small emitter leakage current will flow. If $V_e$ becomes greater than ISR times $V_{bb}$, the emitter will be forward biased and emitter current will flow. In the typical unijunction transistor emitter current consists primarily of holes injected into the silicon bar which drift down the bar from the emitter to base 1 (the grounded base) and results in an equal increase in the number of electrons in the emitter to base 1 region. Thus, the emitter characteristic is such that as emitter current increases, the emitter voltage decreases, thus the emitter exhibits a negative resistance characteristic. The unijunction transistor is recognized as a highly reliable device which has a stable firing voltage fixed by a fraction of the applied interbase voltage, a very low firing current, a negative resistance characteristic uniform and a stable from unit to unit, a high pulse current capability and generally a low cost. Thus, it will be observed in conjunction with an RC charging circuit the triggering or switching of a unijunction emitter to base 1 from a high to a low impedance state is reproducibly achieved.

Although the unijunction transistor has many desirable features and is a highly reliable device affording extremely good, reproducible results, the firing voltage is dependent on the interbase $V_{bb}$, voltage. Consequently, to achieve reproducibility as a trigger device, it is necessary that the RC charging circuit provide an emitter voltage with a fixed relationship to the interbase voltage during each timing sequence. Thus, in an A.C. power control circuit the charging current to produce the trigger voltage must be independent of the interbase current $I_{bb}$. In a half wave power control circuit utilizing a single SCR no difficulties are encountered. However, in a full wave A.C. power control circuit utilizing a pair of SCR's and a pair of unijunction transistors, it is necessary, not only to provide independent charging paths to develop the firing potential at the emitter of each unijunction transistor, but also to clamp the emitter to the base 1 potential of each unijunction transistor during the negative half cycle operation. Although the unijunction transistors could be coupled back to back (base 2 to base 2) through a resistor with a variable resistor between the emitters as a common resistor for the charging paths, the clamping circuit or diode shunt would still be required.

The duojunction transistor appertaining to the invention when used in a power control circuit would replace a pair of unijunction transistors and eliminate the diode clamping function necessary to prevent reverse biasing of the emitter to base junction on the negative half cycle. The duojunction transistor comprises essentially a bar of semiconductor material having a uniform resistivity throughout the bar with an emitter junction in close proximity to each end of the bar. The distance between emitters is more than a diffusion length for minority carrier in the bar. If the bar is picked to be N-type silicon the emitters are regions of P-type material. Also a portion of each end of the bar is diffused with P-type impurities to provide a PN junction near each end of the bar. Each PN junction at the end of the bar is shorted by a contact covering part of the P-type material and part of the N-type material. The distance between an emitter and adjacent P-type portion is within such diffusion length. In this manner it will be seen that each emitter to its adjacent base has a PNP transistor structure while at the same time the bar furnishes a voltage divider between its ends similar to the unijunction transistor.

In operation of the duojunction transistor, when an emitter junction is negative with respect to its adjacent base, the P region at such base acts as an emitter for the PNP transistor structure and conducts at saturation to maintain the duojunction emitter adjacent the base very near the base potential, avoiding any reverse biasing potential developing between such emitter and its adjacent base. In this manner, the effect is to provide an interbase voltage between such emitter and the distant base producing a constant intrinsic standoff ratio for developing the firing potential. Hence, the duojunction transistor performs as a unijunction transistor between either emitter and its distant base, depending on the potential applied between the bases. Thus, considering the duojunction transistor with bases $B_1$ and $B_2$ and adjacent emitters $E_1$ and $E_2$ respectively, when $B_1$ is positive the interbase voltage is effectively between $E_1$ and $B_2$, thus the intrinsic standoff ratio at $E_2$ is maintained constant; likewise, when $B_2$ is positive with respect to $B_1$, the interbase voltage is effectively between $E_2$ and $B_1$, thus the intrinsic standoff ratio at $E_1$ is constant. When $B_1$ is positive with respect to $B_2$ in order to effectively maintain $E_1$ at the same potential as $B_1$, the P region at $B_1$ operates as the emitter of a PNP transistor injecting holes into the N-type bar under saturation conditions. The holes are collected by $E_1$ of the duojunction transistor thus clamping $E_1$ at the $B_1$ bias level. However, not all of the holes injected into the N-type bar are collected by the $E_1$ and some few diffuse and drift down the bar towards $B_2$ which has the effect of neutralizing electrons flowing from $B_2$ to $B_1$, thus effecting a decrease in the interbase resistance consequently slightly modulating the interbase resistance appearing between emitter $E_1$ and base $B_2$. Although the duojunction transistor will work under these conditions of slight modulation, it is desirable to cross diffuse an N plus region into the bar, thus separating emitter $E_1$ and emitter $E_2$ by an N plus region, hence, any holes drifting down the bar will be neutralized by the excess electrons in the N plus region and not interfere or cause modulation of the interbase resistance. Of course, cross diffusion to form the N plus region is merely one way to trap out the holes.

Since the P and N regions at base $B_2$ are shunted together and the PN junction emitter $E_2$ is reverse bias, the P region cannot act as an emitter for the PNP device between $E_2$ and $B_2$. Likewise the voltage at $E_2$ must exceed the intrinsic standoff ratio times the interbase voltage before the emitter $E_2$ junction becomes forward biased generating emitter current and reducing the $E_2$ to $B_2$ resistance. When the volatge on $E_2$ reaches the forward biasing potential, holes will be emitted or injected into the N region causing a substantial increase in electrons flowing into the base $B_2$. The flow of current is aided between emitter $E_2$ and base $B_2$ by the P region near base $B_2$ acting as a collector for a transistor structure.

A modified aspect of the invention includes a duojunction controlled switch (DJCS) which affords a power switch device similar to the duojunction transistor but produces switching from a high impedance to a low impedance between its ends. The DJCS is similar in construction to the duojunction transistor, however, it differs in that the emitters of the DJCS are maintained at least within a diffusion length of each other but sufficiently separated to prevent switching under the influence of interbase voltage. Thus, in comparison with the duojunction transistor when the emitter to adjacent base of the DJCS enters the negative resistance region or low impedance state instead of merely permitting high emitter current, the DJCS switches from a high impedance to a low impedance throughout. In addition to geometrical spacing to achieve breakover from end to end of the DJCS, preferably a field effect region is provided to prevent low drift or diffusion current from flowing between emitters. This field effect region maintains a constant interbase voltage from the high potential emitter to its distant base; yet once the low potential emitter reaches the intrinsic standoff ratio voltage and is forward biased, the DJCS exhibits transistor action conducting between emitters, effectively switching the entire DJCS to the low impedance state.

In another aspect of the invention a slow switching semi-conductor control rectifier is provided. Briefly, the slow switching semiconductor control retcifier is an elongated semiconductor body having the conventional PNPN controlled rectifier structure. The firing potential at the gate input is applied over a relatively small portion of the cathode PN junction and only a conterminous small portion of the center PN junction initially breaks down under influence of the firing potential in the presence of anode blocking voltage. Thereafter the current drive in the device gradually breaks down the entire central PN junction of the device. Thus, when the control rectifier initially fires the impedance decreases at a linear rate between the power contacts, thus decreasing the voltage drop across the switch at a linear rate rather than as a step function, consequently applying an increased load voltage across a load in series with the switch at a uniform linear rate.

The innovation of the duojunction transistor and the slow switching silicon control rectifier may be utilized separately or combined in the unique semiconductor integrated circuit appertaining to the invention. The semiconductor integrated network or circuit appertaining to the invention provides a complete symmetrical power control circuit device which when coupled in series with a load across an A.C. source of power affords a complete full wave power control package for many different purposes.

It is therefore an object of the invention to provide a semiconductor integrated circuit power control network which is highly reliable and inexpensive to manufacture which affords complete control of power being supplied to a load;

It is another object of the invention to provide a symmetrical power control semiconductor network suitable for maintaining full wave control of A.C. power supplied to a load;

It is another object of the invention to provide a duojunction transistor suitable for generating semiconductor control rectifier firing signals appropriate for full wave operation of a power control circuit including such control rectifiers;

It is another object of the invention to provide a duojunction semiconductor device comprising a body of semiconductor material of one conductivity type having a first pair of spaced apart regions of opposite type conductivity and a second pair of spaced apart regions of opposite type conductivity intermediate said first pair of regions, regions of adjacency of said first pair to said second pair being separated by no more than a diffusion length of minority carriers for said body, each region of said first pair of regions having a common electrical contact with said body, said second pair of regions being separated by more than said diffusion length, each region of said second pair of regions having an electrical contact thereto.

It is another object of the invention to provide a duojunction transistor comprising a semiconductor body of one type conductivity having an opposite-type conductivity region and a contact shunting such region to said body at each end thereof and a pair of spaced apart rectifying electrodes to said body intermediate the ends therof, said body exhibiting a negative resistance characteristic between each rectifying electrode and the nearest adjacent end contact;

It is still another object of the invention to provide a duojunction transistor comprising a semiconductor body of one-type conductivity having a pair of spaced apart opposite-type conductivity regions, each region shorted to said body along the PN junction therebetween by an electrical contact, a pair of spaced apart rectifying electrodes intermediate said pair of opposite-type conductivity regions, each rectifying electrode to its nearest adjacent shunting contact exhibiting a negative resistance characteristic;

It is still another object of the invention to provide a duojunction controlled switch suitable as a bilateral power control switch;

It is yet another object of the invention to provide a duojunction controlled switch appropriate for supplying full wave control of an A.C. power source applied to a load;

It is still yet another object of the invention to provide a duojunction controlled switch comprising a semi-conductor body of one-type conductivity having an opposite-type conductivity region and a contact shunting such region to said body at each end thereof and a pair of spaced apart rectifying electrodes to said body intermediate the ends thereof, said body exhibiting a negative resistance characteristic between each rectifying electrode and the nearest adjacent end contact, as well as switching to a low impedance between said rectifying electrodes when one of said rectifying electrodes and the nearest adjacent end contact is maintained within the negative resistance region;

Yet another object of the invention is to provide a duojunction controlled switch comprising a body of semiconductor material of one type conductivity having four distinct regions of opposite-type conductivity positioned sequentially along substantially the entire length of said body, each of said four distinct regions being within at least a diffusion length for minority carriers in said body of the next region of sequentiality;

It is another object of the invention to provide a semiconductor control rectifier exhibiting a gradual linear decrease in resistivity when a triggering pulse is impressed on the gate thereof;

It is still a further object of the invention to provide a semiconductor integrated circuit embodying a duojunction transistor and a symmetrical bilateral semiconductor switch;

Another object of the invention to provide a semiconductor integrated network power control circuit which affords full wave control of A.C. power supplied to a load;

These and other objects and advantages of the invention will become readily apparent when taken in conjunction with the appended claims and the drawings wherein;

FIGURE 1 symbolically illustrates the duojunction transistor and a modification thereto;

Figure 1:
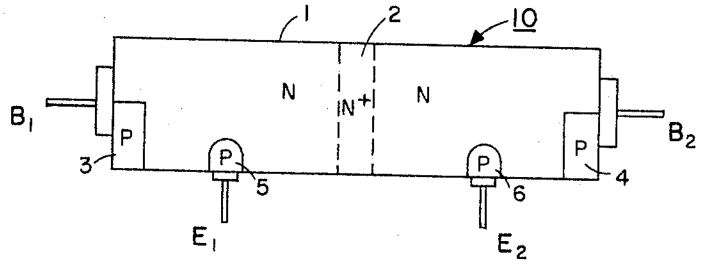
Figure 2:
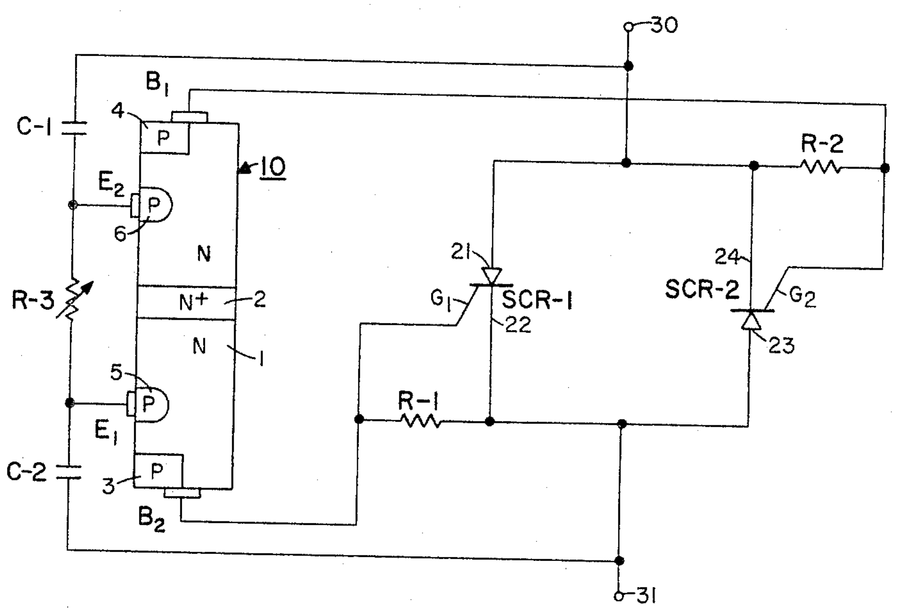
FIGURE 2 illustrates the symbolic duojunction transistor with the modification in a pulse network for supplying a trigger impulse to a pair of silicon control rectifiers achieving a power control circuit which affords full wave control of an A.C. power source to a load.

Referring specifically to FIGURES 1 and 2, there is illustrated the duojunction transistor, generally designated 10, appertaining to the invention. The duojunction transistor is a semiconductor body 1 preferable of N-type conductivity and optionally may include a region 2 of N-plus-type conductivity. At each end thereof, there is a P-type region 3 and 4. P region 3 is shorted to N-type body 1 by a contact $B_1$ and likewise P region 4 is shorted to N-type body 1 by contact $B_2$. Near contact $B_1$ is a rectifying electrode $E_1$ having a P-type region 5 associated therewith. P regions 3 and 5 are separated by approximately less than a diffusion length for minority carriers in N-type body 1. Near contact $B_2$ is a rectifying electrode $E_2$ having a P-type region 6 associated therewith. P region 6 and P region 4 are separated by approximately less than a diffusion length for minority carriers in the N-type body 1. P region 5 and P region 6 are separated by much more than a diffusion length for minority carriers in body 1. By utilizing N plus region 2, rectifying electrodes $E_1$ and $E_2$ may be spaced much closer together since N plus region 2 acts as a trap for minority carriers which tend to drift through the bar.

In order to best understand the functioning of duojunction transistor appertaining to the invention, it is helpful to consider the device in the power control circuit of FIGURE 2. Semiconductor control rectifier 1 and semiconductor control rectifier 2 (SCR–1 and 2) are illustrated in a conventional bridge circuit in which anode 21 of SCR–1 is coupled to a source of A.C. power at contact 30 and the cathode 24 of SCR–2. Anode 21 is also coupled to gate $G_2$ of SCR–2 through resistor R–2. Likewise, anode 23 of SCR–2 is coupled to the A.C. power source at contact 31 and cathode 22 of SCR–1 as well as to the gate $G_1$ of SCR–1 through resistor R–1. Base $B_2$ of the duojunction transistor 10 is coupled to the junction of R–2 and $G_2$ whereas base $B_1$ is coupled to the junction of R–1 and gate $G_1$ of SCR–1. In the circuit, rectifying electrode $E_2$ is coupled to A.C. power source contact 30 by capacitor C–1, and rectifying electrode $E_1$ is coupled to A.C. power source contact 31 by capacitor C–2. Electrodes $E_1$ and $E_2$ are coupled together by variable resistor R–3.

First considering duojunction transistor 10 without P regions 4 and 3 and N plus region 2, the duojunction transistor 10 would be similar to a pair of unijunction transistors back to back.

On application of an A.C. potential positive at contact 30 and ground at contact 31, at that instant $B_2$ and the top of C–1 have a positive potential. Electrons flow from contact $B_1$ to contact $B_2$, establishing a simple voltage divider therebetween depending on the resistivity of the bar. At the same time that electrons flow from contact $B_1$ to $B_2$, capacitor C–1 starts charging, but because of the lag in charging capacitor C–1, the rectifying electrode $E_2$ is instantaneously at the same positive potential as that appearing at $B_2$, thus $E_2$ is at a higher potential than the region immediately adjacent to P-type region 6, hence, the PN junction between region 6 and body 1 becomes forward biased, thus causing current to flow between electrode $E_2$ and base $B_1$. Likewise, charging current for C–1 flows through R–3 and C–2. Thus, the initial charging current for C–1 flows from C–1 through $E_2$ to $B_1$ and from C–1 through R–3 and C–2 thereby changing the relative voltage drop between contact $B_1$ and electrode $E_1$, hence, the intrinsic standoff ratio at electrode $E_1$ decreases due to the charging current flowing through C–1 from $E_2$ to $B_1$ and increases as C–1 becomes charged. Hence, since the intrinsic standoff ratio at $E_1$ ffunctuates and the charging voltage for C–2 fluctuates as the voltage at $E_2$, the firing sequence occurring when $E_1$ become forward biased is erratic, and consequently the voltage or firing potential at $G_1$ of SCR–1 is erratic. This is particularly significant in view of the fact that on the negative half cycle C–1 is not fully discarged before the sequence is repeated. Therefore in each case whether it is C–1 or C–2 charging to forward bias $E_2$ or $E_1$, respectively, the charge remaining on the capacitors prevents precise timing, and the firing potential at $G_1$ and $G_2$ of SCR–1 and SCR–2, respectively, is erratic. Because the firing potentials on SCR–1 and SCR–2 are erratic, the application of power to the load is erratic.

Now considering duojunction transistor 10 with P region 4 and P region 3 diffused or created therein, a PNP transistor structure exists from $B_2$ to $E_2$ and likewise from $B_1$ to $E_1$. Under these conditions when $B_2$ becomes positive the voltage at $E_2$ is clamped or shunted to $B_2$ because of the transistor saturation current flowing between $B_2$ and $E_2$. Thus, the ISR of $E_1$ remains constant and C–2 charges from a zero potential toward the fixed potential at $E_2$, hence, except for a drifting of a few minority carriers into the region between $E_2$ and $B_1$ the semiconductor bar between $E_2$ and $B_1$ provides a highly stable voltage divider and, therefore, a highly stable intrinsic stand-off ratio at $E_1$. Thus the firing potential at the gate $G_1$ of the SCR–1 is provided in a highly reliable timing sequence. Likewise, a highly reliable firing potential is developed at $G_2$ of SCR–2 on the negative half cycle. By providing cross-diffused N plus region 2 intermediate rectifying electrodes $E_1$ and $E_2$, the minority carriers not collected when either $E_2$ is acting as the collector of a PNP transistor or $E_1$ is acting as a collector of a PNP transistor, are neutralized by the excessive number of electrons in the N-plus region without significant effect on the voltage divider existing in one direction between $E_2$ and $B_1$ and in the other direction between $E_1$ and $B_2$ of the duojunction transistor. It should be pointed out that the significant advantages of creating the PNP structure is two-fold. First, the transistor action at the high potential base and emitter of the duojuncion transistor completely shunts its associated capacitor, thus, at the start of each changing cycle, the capacitor has a zero charge. Second, the region between the low potential base and emitter of the duojunction transistor afford transistor action when the emitter or rectifying electrode of the duojunction transistor becomes forward biased, injecting minority carries into the body 1.

Figure 3:
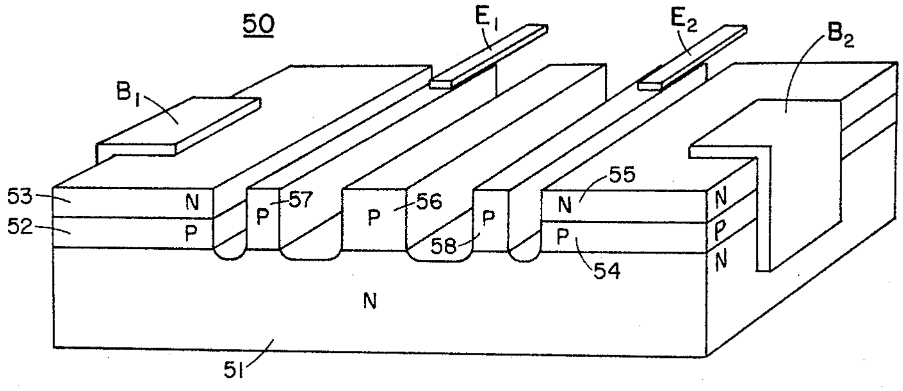
FIGURE 3 is a perspective view illustrating the duojunction transistor in a modified form to produce the stable intrinsic standoff ratio.

Referring now to FIGURE 3 there is illustrated the duojunction transistor of the improved version generally designated 50. The device is formed of a block or bar of semiconductor material having a uniform resistivity of either N or P-type conductivity. Various diffusions and etches are made on one side of the bar to achieve the configuration illustrated in FIGURE 3. The duojunction transistor 50 includes a region 51 which is part of the starting bar or block of semiconductor material having regions of P-type conductivity 54, 58, 56 and 57 and 52. These regions are diffused in at one instance. After this diffusion a second N-type diffusion is performed to form N-type regions 53 and 55. After the N-type diffusions, the device is etched to define P-type region 57, 57 and 58. Regions 51, 54 and 55 are shorted together by base contact $B_2$. Emitter contacts $E_1$ and $E_2$ are attached to P-type regions 57 and 58, respectively.

Figure 4:
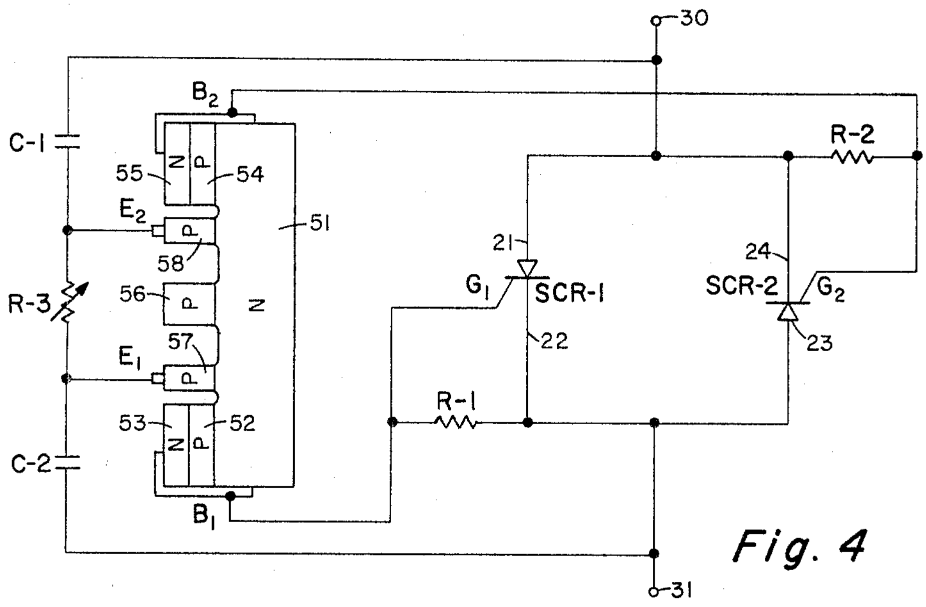
FIGURE 4 illustrates the duojunction transistor of FIGURE 3 in a power control circuit similar to the circuit illustrated in FIGURE 2.

In FIGURE 4 there is illustrated the duojunction transistor depicted in FIGURE 3 in an SCR power control circuit similar to the circuit of FIGURE 2. It will be noted in conjunction with FIGURE 3 that the duojunction transistor 50 has an NPNP structure of region 55, 54, 51 and 58 with a contact $B_2$ shorting regions 55, 54 and 51 together. At the instance when a positive voltage is applied to contact $B_2$ PN junction 54 to junction 54 to 51 is forward biased since region 51 acts as a voltage divider. Also, the voltage at $E_2$ is at about the same potential as $B_2$ since there is a lag in charge time of capacitor C–1. Since $E_2$ is slightly negative with respect to $B_2$, PN junction 58–51 is reverse biased and the regions 54, 51 and 58 operate as a PNP transistor under saturation thus maintaining the voltage at the junction of $E_2$ and R–3 constant near the $B_2$ level. Of course as mentioned before, not all of the holes injected from the emitter of the transistor structure into region 51 will be collected by P region 58 and these holes will drift down the bar towards contact $B_1$. However, floating P region 56 will collect the holes that drift past P region 58 and thus neutralize them. Therefore the intrinsic standoff ratio with respect to $E_1$ is constant and capacitor C–2 is charging towards the voltage at $E_2$ which is essentially the voltage at $B_2$. Since $E_1$ has a stable intrinsic standoff ratio, the duojunction transistor retains all the stability and reliability characteristics of a unijunction transistor. The PNPN device between $E_1$ and $B_1$ formed by P region 57, N region 51, P region 52 and N region 53 provides a significant advantage over a normal unijunction transistor emitter characteristic. That is when the voltage at $E_1$ increases sufficient to forward bias PN junction 57 to 51, the PNPN device fires similarly as a four layer diode and produces a high pulse current. Such currents are possible because of the field existing across junction 53–52 near the region of $E_1$ and because of the low resistivity of region 53. Typically, the bulk resistivity of the duojunction transistor in region 51 is approximately 100–200 ohm-cm. whereas the apparent resistivity of P regions 52, 56, 54, 57 and 58 is three to ten ohm-cm. and N regions 53 and 55 is 0.1 to 0.3 ohm-cm.

Figure 5A:
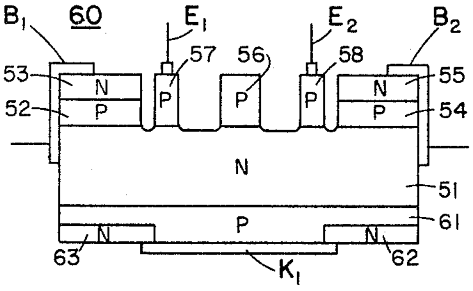
FIGURE 5A illustrates a duojunction transistor symmetrical switch modification of FIGURE 3.

Referring specifically to FIGURE 5A, there is illustrated a duojunction symmetrical switch embodiment of the invention. The symmetrical switch, generally designated 60, is identical to duojunction transistor 50 (like portions having identical numbers) with the additional P-type region 61 extending across the length of N-type region 51. Also, P-type region 61 has N-type region 62 near P-region 54 and N-type region 63 near P-region 52, ohmic contact $K_1$ shunts regions 63, 62 and 61 together. The effect of contact $K_1$ and its associated regions is to provide a low current path between contacts $B_1$ and $B_2$. Such low current path is established when the device between either $B_1$ and $E_1$ or $B_2$ and $E_2$ fires. The current, when the $B_1$ to $E_1$ device fires, is sufficient to cause current flow between P-region 61, N-region 51 and P-region 52. Contact $K_1$ affords a low impedance path to N-region 62, thus the NPNP device formed by N-region 62, P-region 61, N-region 51 and P-region 54 breaks over and the device 60 switches to a low impedance between contacts $B_1$ and $B_2$ with the aid of contact $K_1$. Similarly, when $B_2$ to $E_2$ device fires, the current is sufficient to cause current flow between P-region 61, N-type region 51 and P-type region 54. This, in turn permits NPNP device of regions 63, 61, 51 and 52 to break over. Thus the device seeks a low impedance state between contacts $B_2$ and $B_1$, with the aid of contact $K_1$ and its associated floating regions. It will be appreciated that N-regions 62 and 63 are of same apparent resistivity as regions 53 and 55 and region 61 is the same apparent resistivity as region 56. Therefore it will be further understood that contact $K_1$ and N-type regions 62 and 63 could be placed in floating region 56 instead of creating region 61.

Figure 5B:
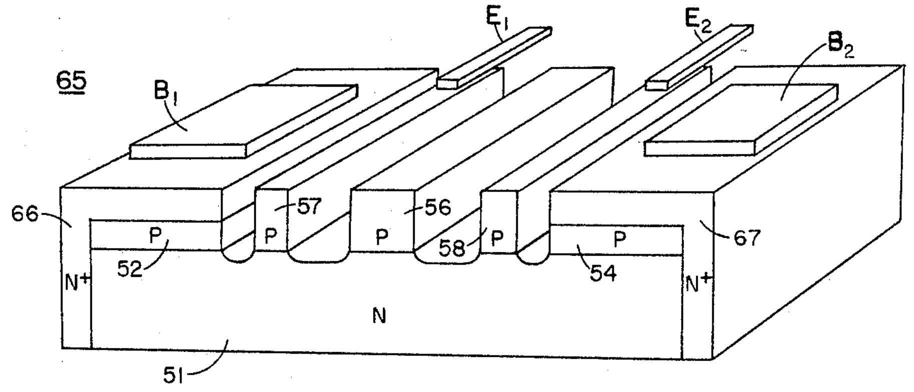
FIGURE 5B illustrates in perspective a further modification to the duojunction transistor of FIGURE 3.

Referring specifically to FIGURE 5B, there is illustrated the duojunction transistor of FIGURE 3 somewhat modified, generally designated 65. In the duojunction transistor, N plus type regions 66 and 67 are utilized to eliminate the shunting function of contacts $B_1$ and $B_2$ as illustrated in FIGURE 3. The N plus regions 66 and 67 are low resistivity semiconductor material, hence, aid current flow of the regions acting as either a transistor structure or as a four layer diode. In other respects the operation of duojunction transistor 65 is as described with respect to duojunction transistor 50.

The duojunction transistor illustrated in FIGURES 1 and 2 is made by the following procedure utilizing techniques and methods which are well known in the art. The duojunction transistor was made from a silicon bar of N-type conductivity having a starting or bulk resistivity of 100 to 200 ohm-cm. The bar was 150 mils by 30 mils by 5 mils thick. The bar was steam oxidized at 1200° centigrade for four hours. Using Kodak Metal Etch Resist (KMER) and a suitable mask, the oxide was removed from those areas to be P-type diffused. The P-type diffusion was done in an open tube furnace using boron as the diffusant. The source of boron was boric acid maintained at 400° centigrade with a nitrogen gas stream of 2 liters per minute flowing across the boric acid source and into the diffusion furnace. The diffusion furnace was maintained at 1200° centigrade and the boron diffusion was conducted for eight hours. The P-type regions penetrated about 1.2 mils and gave an apparent surface resistivity of from 0.1 to 10 ohm-cm. as measured by the well known 4-point probe technique using 50 mil spacing.

After diffusing, the bar was leached with HF to remove the oxide, and then the bar was again oxidized in steam as before. Using KMER and a suitable mask, the oxide was removed to make the N-plus cross-diffusion. The N-plus diffusion was done using phosphorous as the diffusant from a phosphorous pentoxide source. The source was maintained at a tempearture of 400° centigrade with oxygen gas flowing at 2 liters per minute thereover as a carrier gas. The bar was maintained at 1200° centigrade in an open tube diffusion furnace, and the diffusion was conducted for about 12 to 14 hours to produce the N-plus cross-diffused region in the bar. The N-plus region had an apparent resistivity of .01 to 1 ohm-cm. and completely penetrated the bar. The oxide and glaze (from the N-plus diffusion) was removed with HF and the bar was plated for ohmic contacts in the appropriate regions. Using KMER and a suitable mask, the bar was etched to clean up the surface and remove the plating from those areas not requiring contact.

The duojunction transistor illustrated in FIGURES 3, 4 and 5 were made by similar procedures as the duojunction transistor illustrated in FIGURES 1 and 2. A silicon bar 150 mils by 30 mils by 5 mils thick having a bulk resistivity of 100 to 200 ohm-cm. was the starting material. The bar was oxidized in steam at 1200° centigrade for 4 hours. The bar was then gallium diffused at 1200° centigrade for 24 hours with gallium oxide as the diffusant source. The gallium oxide was maintained at 850° centigrade with 2 liters per minute of hydrogen carrier gas flowing at a zero degree centigrade dew point thereover. The P-type layer formed was about 1.2 mils deep and had an apparent resistivity of about 10 ohm-cm., as measured by the well known 4-point probe technique, The bar was leached in hydrofluoric acid to remove the oxide, and the bar was then again steam oxidized. Using KMER and a suitable mask, the oxide was selectively removed to permit N-type diffusion for the required configuration of the particular duojunction transistor. Thus, the devices depicted in FIGURES 3 and 4 had the end portions of the top surface exposed, and the device depicted in FIGURE 5 had the ends of both the bar and top surface exposed. Phosphorous was used for the N-type diffusion which was conducted exactly as described with regard to the N-type cross diffusion of devices in FIGURES 1 and 2. The apparent surface resistivity of the N-type regions was about 0.2 to 0.4 ohm-cm. and the N-type layer was approximately 0.1 mil thick. The oxide and glaze (from the N-type diffusion) were removed with HF and the surfaces plated for ohmic contacts. Using KMER and a suitable mask, the bar was etched to form the mesas and remove unwanted material.

Figure 6:
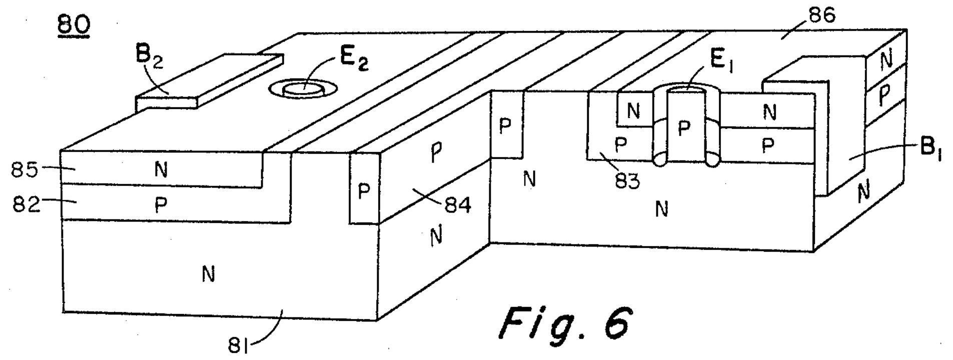
FIGURE 6 illustrates the duojunction controlled switch in perspective with a quarter section removed.

Referring now to FIGURE 6 there is illustrated a duojunction controlled switch (DJCS) generally designated 80 which is similar in construction as the duojunction transistor with certain changes. The DJCS is an N-type bar 81 having P-type diffused regions 82, 83 and 84. P region 82 has an N region 85 diffused therein except for a discrete mesa region of emitter $E_2$ separated therefrom by a moat or channel etched down into N region 81. A quarter section of DJCS 80 has been removed to best illustrate the construction thereof. This removed portion of the device is identical in every respect to the portion surrounding $E_1$, in fact, it is a mirror image thereof. The boundary of N region 86 diffused in the P region 83 illustrates the construction and isolation of emitter $E_1$. Thus it will be observed that DJCS 80 has an NPNP construction between base $B_1$ and emitter $E_1$ as well as between base $B_2$ and emitter $E_2$. Region 84 is a field effect region to prevent switching of DJCS 80 from its high impedance state to low impedance state under the influence of normal bar current.

In operation the duojunction controlled switch (DJCS) is a bilateral switch similar to the duojunction transistor. Thus, assuming a voltage potential applied between base $B_1$ and $B_2$ with a capacitor between base $B_1$ and emitter $E_1$, a variable resistor between emitter $E_1$ and emitter $E_2$ and a caapcitor between emitter $E_2$ and base $B_2$, the DJCS will operate as a bilateral power switch changing from a high impedance to a low impedance between bases $B_1$ and $B_2$. The bilateral switching of DJCS 80 is accomplished in the same manner as generating a firing potential at either emitter of the duojunction transistor. Considering the application of a positive voltage to base $B_1$, P-type region 83, N-type region 81 and the P region of emitter $E_1$ operate as a PNP transistor with P region 83 as the emitter. Thus, the PNP transistor on application of the positive voltage at $B_1$ conducts at saturation clamping emitter $E_1$ at the voltage level appearing at base $B_1$. The N-type region of bar 81 between emitter $E_1$ and base $B_2$ then operates as a voltage divider with a constant intrinsic standoff ratio (ISR) appearing at emitter $E_2$. The minority carriers injected from region 83 into N region 81 are prevented from drifting the entire length of the bar by P region 84. As the voltage at $E_2$ developed by the capacitor between $E_2$ and $B_2$ increases sufficiently to forward bias the junction of emitter $E_2$ to N region 81, $E_2$ begins injecting minority carriers into region 81 which is sufficient to cause breakover of the PNPN device existing between emitter $E_2$ and base $B_2$. With the large current flow from $E_2$ to $B_2$, the interbase resistance between $B_2$ and $E_2$ decreases, effectively placing the entire interbase voltage between P regions 82 and 83 at the edges nearest P region 84. Thus the field for promoting diffusion and drift of holes from P region 83 to P region 82 is greatly increased, and field effect P region 84 is then ineffective to neutralize the holes drifting from P region 83 to P region 82. Under these conditions, hole current begins to increase to the extent that P region 83, N region 81 and P region 82 operate as a PNP transistor conducting at saturation, switching DJCS 80 from its high impedance state to its low impedance state between base $B_1$ and base $B_2$. The operation of DJCS 80 is enhanced by forming P region 82 and P region 83 within a diffusion length for minority carriers in N region 81.

Typically, the duojunction controlled switch is made in a similar manner as the duojunction transistor illustrated in FIGURES 1 and 2. The starting material for the DJCS was N-type silicon having a bulk resistivity of from 100 to 200 ohm-cm. and physically about 200 to 400 mils by 40 to 80 mils by 7 to 15 mils thick. The starting bar was steam oxidized at 1200° centigrade for 4 hours, and then using KMER and a suitable mask, the oxide was removed at the end surfaces and in the center for the P-type diffusion. The P-type region was obtained by boron diffusion for 8 hours at 1200° centigrade as heretofore described with reference to FIGURES 1 and 2. The bar was then leached with hydrofluoric acid to remove the oxide, and then again steam oxidized. The P-type region had an apparent resistivity of 0.1 to 10 ohms centimeters. Using KMER and a suitable mask, the oxide was removed from the end regions where N-type diffusion was to be done, leaving of course a circular spot where the P-type mesa emitters were to be formed. The N-type diffusion was done using phosphorous as heretofore described with respect to FIGURES 3, 4 and 5. After the phosphorus diffusion, the oxide and glaze (from the N-type diffusion) were removed using hydrofluoric acid. The bar was then plated for ohmic contacts. Using KMER and a suitable mask, the mesa regions and other areas of the bar were etched as required.

Figure 7:
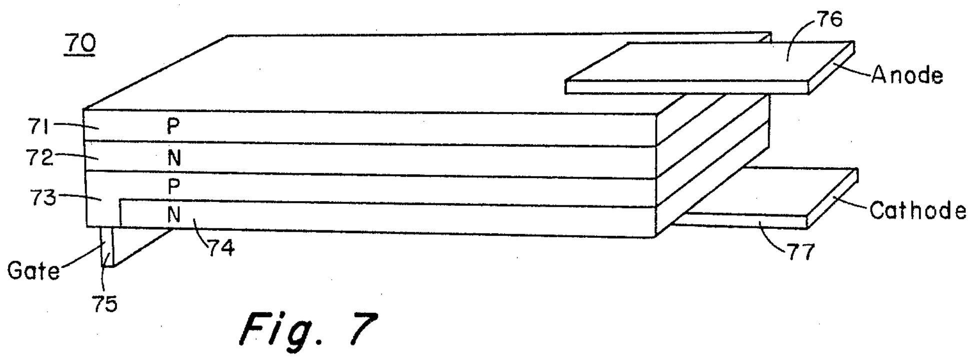
FIGURE 7 illustrates the slow switching silicon control rectifier appertaining to the invention.

Referring to FIGURE 7, there is illustrated the slow switching semiconductor control rectifier of the invention. Preferably, the device is an elongated silicon bar generally designated 70 having P-type region 71 with an apparent resistivity of from 0.5 to 1 ohm-cm., N-type region 72 with a bulk resistivity of 100 to 200 ohm-cm., P-type region 73 with an apparent resistivity of from about 3 to 10 ohm-cm. and N-type region 74 with an apparent resistivity from about 0.05 to 0.2 ohm-cm. A gate electrode 75 is provided to P region 73. An anode 76 is attached to P layer 71 at the end of the bar furtherest away from gate 75, and a cathode 77 is attached to region 74 on the same end as anode 76. When anode blocking voltage is applied between the anode 76 and cathode 77 PN junction 73–72 is reversed biased and very little current flows between anode 76 and cathode 77. On the application of a gate signal at gate input 75 PN junction 73–72 undergoes breakdown near the gate input 75 causing current flow near the gate between anode 76 and cathode 77. As the current flow increases the PN junction 73–72 continues to breakdown from the region nearest gate 75 towards the area of contacts 76 and 77, thus slowly decreasing the impedance appearing between anode 76 and cathode 77, and eventually the current increases all along the PN junction 73–72. Thus, the device can be considered equivalent to a series of parallel SCR's with a series of cathode resistors in decreasing resistance values, respectively. With the cathode of one SCR coupled to the gate of the next, the resistance between the common anode and cathode of the parallel control rectifiers undergoes a step decrease as each semiconductor control rectifier is fired by the preceding semiconductor control rectifier.

The slow switching silicon control rectifier of FIGURE 7 was made in a manner quite similar to the duojunction transistor illustrated in FIGURES 3, 4 and 5. A silicon bar 150 mils by 30 mils by 5 mils thick having a bulk resistivity of 100 to 200 ohm-cm. was the starting material. The bar was oxidized in steam at 1200° centigrade for 4 hours. The bar was then gallium diffused at 1200° centigrade for 24 hours with gallium oxide as the diffusant source. The gallium oxide was maintained at 850° centigrade with two liters per minute of hydrogen carrier gas flowing at a zero degree centigrade dew point thereover. The P-type layer formed was about 1.2 mils deep and had an apparent resistivity of about 10 ohm-cm., as measured by the well known 4-point probe technique mentioned heretofore. The bar was leached in hydrofluoric acid to remove the oxide, and the bar was then again steam oxidized. Using KMER and a suitable mask, the oxide was selectively removed from the P-type diffused region to permit N-type diffusion to form the cathode. Phosphorus was used for the N-type diffusion which was conducted exactly as described for the devices depicted in FIGURES 1 and 2. The oxide and glaze (from the N-type diffusion) were removed by leaching in hydrofluoric acid. The device was then again oxidized in steam at 1200° centigrade as before. Using KMER and a suitable mask, the oxide was removed from the N-type starting material for the device to permit diffusion of the anode. The anode was formed by diffusion with boron in the exact same manner as described in forming the devices as depicted in FIGURES 1 and 2, except that the diffusion was conducted for about 30 minutes and gave an apparent resistivity of 1 to 3 ohms centimeters for the anode. Next the oxide was removed with hydrofluoric acid and the device plated for ohmic contacts for the anode, cathode and gate areas. Appropriate leads were soldered to the device and it was then etched in a mixture of hydrofluoric and nitric acid to provide a suitable surface.

Figure 8:
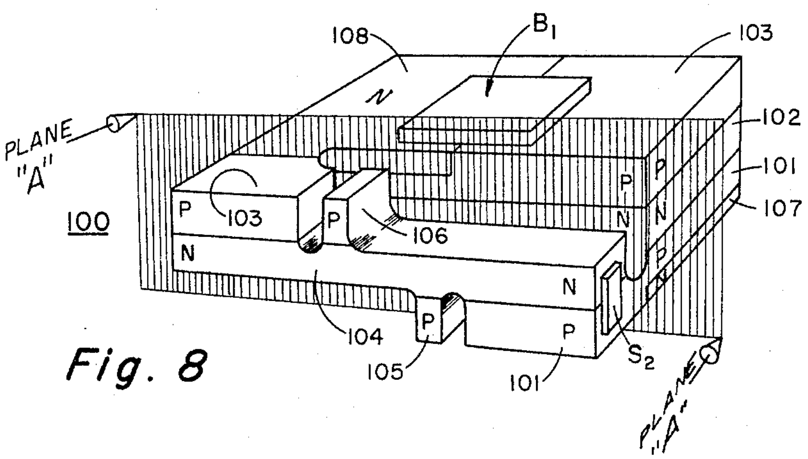
FIGURE 8 illustrates the duojunction transistor schematically represented in FIGURE 1 in a semiconductor integrated circuit.

Referring specifically to FIGURE 8, there is illustrated a semiconductor integrated circuit generally designated 100 depicting a duojunction transistor in front of plane A and an NPNPN power switch device to the rear of plane A. The switch device consists of P-type region 101, N-type region 102 and P-type region 103, with N-type region 107 in part of P region 101 and N-type region 108 in part of P region 103. The duojunction portion of the device consists of N region 104 forming a PN junction to P region 101 and P region 103, P region 101 and P region 103 being partly contiguous to the N region 102. Additionally, mesas define P region 105 and P region 106 which form the emitters of the duojunction transistor as heretofore described with reference to FIGURE 3. Also, contact $B_1$ shunting N region 108 to P region 103 is provided along with a contact $B_2$ (not illustrated) similarly shunting N region 107 to P region 101. Further, contact $S_2$ shunts P region 101 to region 104 whereas a contact $S_1$ (not illustrated) similarly shunts P region 103 to N region 104. Moreover, an emitter contact $E_1$ is made to P region 106 whereas an emitter contact $E_2$ is made to P region 105.

Figure 9:
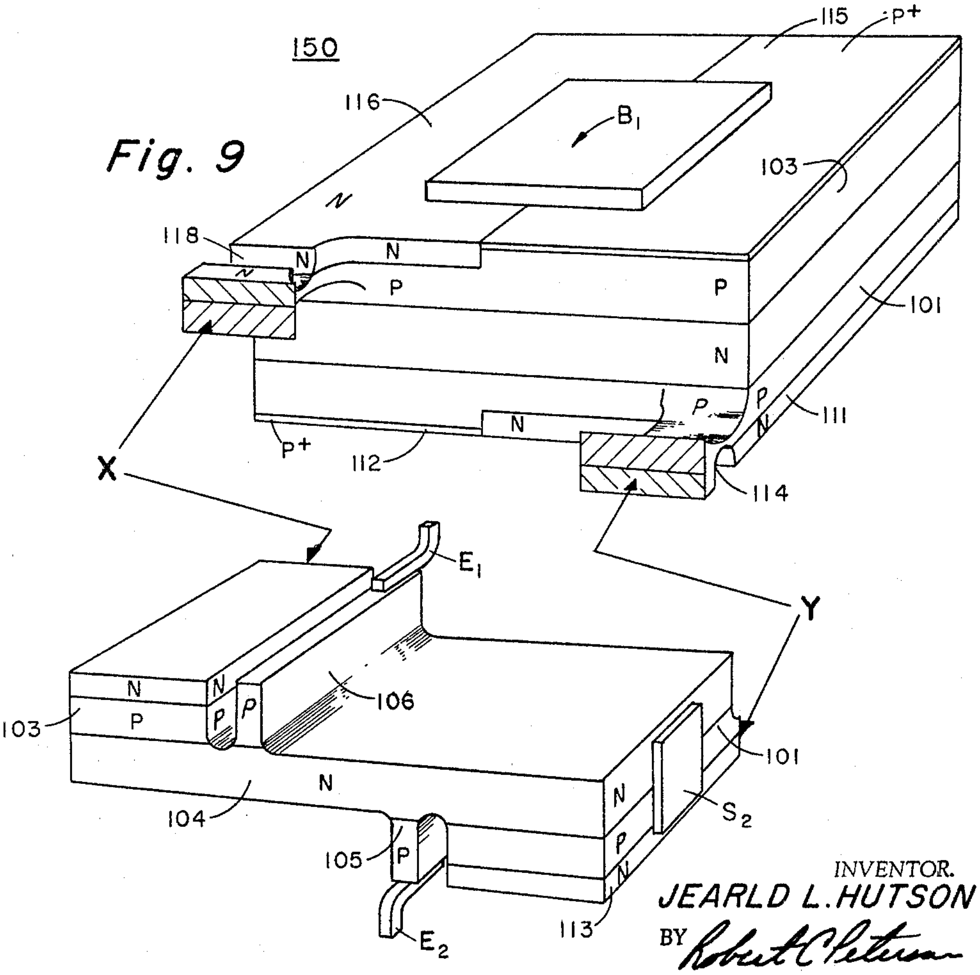
FIGURE 9 depicts the device of FIGURE 8 separated along plane A at areas X and Y to illustrate a symmetrical power control switch to the rear of plane A and a modified duojunction transistor in front of plane A.

Referring now specifically to FIGURE 9, there is illustrated a semiconductor integrated circuit, generally designated 150, similar to integrated circuit 100 depicted in FIGURE 8. In describing the differences between the devices of FIGURE 9 and FIGURE 8 like reference characters of FIGURE 8 will refer to like parts of FIGURE 9. Basically, the integrated circuit 150 is identical with integrated circuit 100 and for clarity the integrated circuit 150 has been separated at X and Y corresponding to intersection along plane A as illustrated in FIGURE 8. In network 150, P region 101 has N-type region 111 and P-plus type region 112 diffused therein. The N region 111 which was diffused into P region 101 is separated to form distinct N-type region 113 by a channel 114. P-region 103 has N-type region 116 and P-plus type region 115 diffused therein. The N region 116 is separated to form distinct N-type region 117 by channel 118. Channels 114 and 118 are so located in their respective regions such that the duojunction transistor portion of the device is interconnected to the control rectifier device portion solely by the P region 101 and P region 103. The duojunction portion of device 150 has a contact $S_2$ shunting N region 104, P region 101 and N region 113 together. Also, N region 117, P region 103 and N region 104 are shunted together by contact $S_1$ (not illustrated) similar to contact $S_2$. Mesa P-type region 106 has a emitter contact $E_1$ attached thereto and mesa P-type region 105 has an emitter contact $E_2$ attached thereto. The control rectifier device portion of circuit 150 has a contact $B_1$ shunting N region 116 to P-plus region 115. Likewise, N region 111 is shunted to P-plus region 112 by contact $B_2$ (not illustrated).

All that is necesary to complete the power control circuit as illustrated in FIGURE 4 in conjunction with the integrated circuit 150 is to provide a capacitor coupling contact $E_1$ of mesa 106 to contact $B_1$ which shunts N region 116 to P-plus 115, and likewise a capacitor coupling $E_2$ of mesa 105 to contact $B_2$ (not shown) which shunts N region 111 to P-plus region 112. Further, it is necessary to couple $E_1$ to $E_2$ through a variable impedance to produce the proper amount of phase shift desired in controlling the A.C. power circuit. It will be appreciated that by applying an A.C. power source across the device (at contacts $B_1$ and $B_2$) in series with a load, a complete symmetrical power switch is provided in a circuit to control the power supplied to a load. In operation for example, when a positive potential is applied to $B_1$ with respect to contact $B_2$ (not shown) a low level current enters region 115 travels through region 103 into the area thereof which is shunted by contact $S_1$ (not illustrated) to regions 117 and 104. Thus, the voltage at region 103 is applied to the emitter of a transistor structure defined by regions 103, 104 and 106. Since the emitter junction 103–104 of the transistor structure is forward biased, saturation current flows through the transistor structure clamping emitter $E_1$ very nearly at the potential applied to $B_1$. Since N region 104 is shunted to P region 101 and N region 113 by contact $S_2$ and since P region 101 is in intimate contact with P plus region 112 which has a contact $B_2$ (not shown) shunting P-plus region 112 to N region 111, a voltage divider exists between $E_1$ and $S_2$ which is substantially developing the entire voltage existing across contacts $B_1$ and $B_2$. The capacitor between contacts $E_2$ and $B_2$ derives its charging current through the variable impedance between contacts $E_1$ and $E_2$. PN junction 105 to 104 remains reversed biased until the voltage on the capacitor exceeds the voltage between $E_1$ and $S_2$ times the intrinsic standoff ratio at which level PN junction 105–104 becomes forward biased thus achieving breakover or firing potential, switching the duojunction transistor between emitter $E_2$ and contact $S_2$ to a low impedance state. When this occurs heavy current flow is produced from contact $E_2$ through P region 101 into N region 111 and to contact $B_2$, thus providing heavy gate current for the silicon control rectifier which comprises P-plus region 115, P region 103, N region 102, P region 101 and N region 111. The gate current flowing through P region 101 is sufficient to cause PN junction 101–102 to undergo breakdown, switching the control rectifier to its low impedance state thus dropping the entire voltage applied between $B_1$ and $B_2$ across the series load. From the above it will be observed that the semiconductor integrated circuit or network 150 functions as a composite duojunction transistor and semiconductor rectifier circuit as illustrated and described with reference to FIGURE 4.

The semiconductor integrated circuits illustrated in FIGURES 8 and 9 are made by quite similar processes as the silicon control rectifier illustrated in FIGURE 7. The starting material for the integrated circuit was N-type silicon having a bulk resistivity of from 100 to 200 ohm-cm. and physically about 200 to 400 mils by 100 to 200 mils by 10 to 20 mils thick. The bar was steam oxidized at 1200° centigrade for 4 hours. It was then gallium diffused for 24 hours at 1200° centigrade with gallium oxide as the diffusant source. The gallium oxide was maintained at 850° centigrade with two liters per minute of hydrogen carrier gas flowing at a zero degree centigrade dew point thereover. The P-type layers formed were about 1.2 mils deep and had an apparent resistivity of about 10 ohm-cm., as measured by the well known 4-point probe technique. The bar was leached in hydrofluoric acid to remove the oxide and the bar was then steam oxidized. Using KMER and a suitable mask, the oxide was selectively removed to permit N-type diffusion for the required configuration of the integrated circuit. Phosphorous was used for the N-type diffusion which was conducted exactly as described with regards to the N-type cross diffusion of devices in FIGURES 1 and 2. Almost half of the P surfaces formed by gallium diffusion were N-type diffused with phosphorous. The surface resistivity of the N-type regions was about 0.2 to 0.4 ohm-cm. and the N-type layers were approximately 0.4 mil thick. The oxide and glaze (from the N-type diffusion) were removed by leaching in HF.

At this point the basic wafer has been completely diffused for forming the structure in FIGURE 8, with the exception of etching the bar to produce the illustrated structure. Of course, it is necessary to make appropriate contacts shunting P region 101 to N region 104 and P region 103 to N region 104, as well as making the contact shunting P region 103 with N region 108 and making the contact shunting N region 107 to P region 101. Also, it is necessary to make contacts to mesa P region 106 and mesa P region 105 .

To finish diffusion of the device illustrated in FIGURE 9, it is necessary to steam oxidize the surfaces as before, and using KMER and a suitable mask, remove the oxide covering the P surfaces of the device. The exposed P region is then diffused to a P plus conductivity with boron. The boron source is boric acid maintained at 400° centigrade with nitrogen gas as a carrier flowing at 2 liters per minute thereover. The boron is introduced in the open tube diffusion furnace which is maintained at 1200° centigrade and the surfaces are boron diffused for thirty minutes. The apparent resistivity of the P plus region was from about 1 to 3 ohm-cm. The oxide is then removed using hydrofluoric acid. Using KMER and a suitable mask, the device was etched to form the configuration illustrated in FIGURE 9. Appropriate contacts were then made to the device to provide the construction illustrated.

Figure 10:
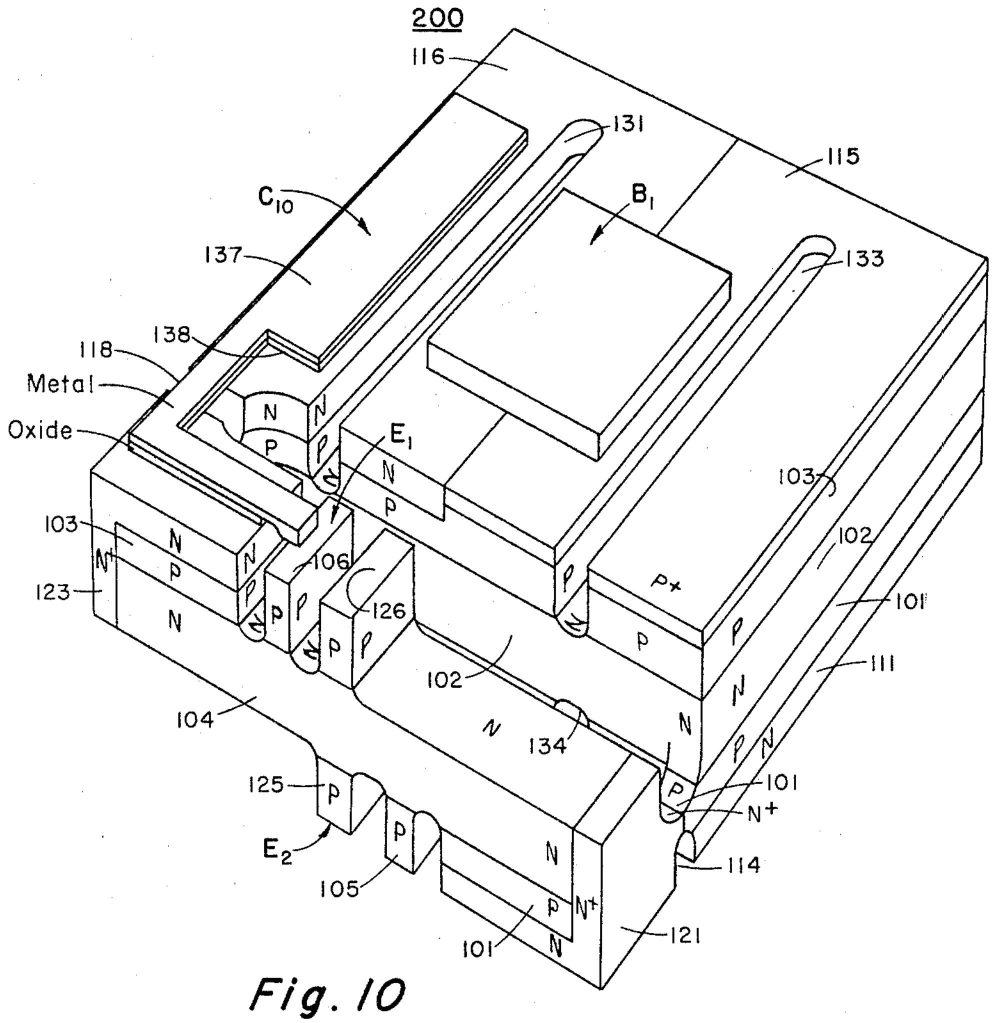
FIGURE 10 illustrates the semiconductor integrated circuit appertaining to the invention including the duojunction transistor region and the slow switching semiconductor control rectifier.

Referring specifically to FIGURE 10 there is illustrated a semiconductor integrated network generally designated 200, including the duojunction transistor and a bilateral power control switch incorporating the principles of the slow switching semiconductor control rectifier. The network includes a pair of capacitor regions electrically interconnecting appropriate portions of the device such that the device is completely self sustaining as a bilateral power control circuit. As illustrated, the power control semiconductor network is quite similar to the devices as illustrated in FIGURES 8 and 9 in which like areas or regions of the device have the same reference numerals. In the integrated circuit device 200, P region 103 has a P plus region 115 diffused therein, and likewise P region 101 has a P-plus region (not shown). Also, an N-type region 116 is diffused in P region 103 and is separated from the duojunction portion of device 200 by channel 118. P region 103 and N region 104 have an N plus type region 123 diffused therein. Likewise P region 101 has an N-type region 111 separated from the duojunction portion of device 200 by channel 114. P region 101 and N region 104 have an N plus type region 121 diffused therein similarly as N plus type region 123. Additionally, P-type region 125 is provided near P region 105 and a P region 126 is provided near P region 106. The P regions 125 and 126 serve the identical function of P region 56 in FIGURE 5 which is to provide a minority carrier trap such that the duojunction transistor portion of device 200 maintains a constant intrinsic standoff ratio between one of the emitter regions 105 and 106 and N plus regions 123 and 121 respectively. To achieve a slow switching control rectifier, a channel 131 is etched through N region 116, P region 103 and into N region 102. A like region is etched through N region 111 and P region 101 and into N region 102 immediately under channel 131. A similar channel 133 is etched through P plus region 115, P region 103 and into N region 102. Also, an opposing channel 134 is etched through N region 111, P region 101 and into N region 102. From a functioning or electrical standpoint the etching of opposing channels to channel 131 and channel 133 is identical to etching channel 131 and 133 throughout the entire device so as to leave a hole completely therethrough. However, from a mechanical standpoint it is preferable not to etch completely through N region 102. The effect of channel 131 and its opposing channel (not shown) and channel 133 and its opposing channel 134 is to provide a slow switching control rectifier having the identical function as that illustrated in FIGURE 7. As viewed in FIGURE 10, when gate current is supplied to P region 101 to the right of channel 134 the P plus PNPN structure to the right of channel 133 and 134 initiates switching to the low impedance state. This switching effectively travels towards the rear of device 200 around behind channel 133 and 134 and then to the contact $B_1$ and $B_2$ (not illustrated). Capacitance for the device which serves the identical function as C–1 in FIGURE 4 is provided by capacitor generally designated C–10 which comprises a metal plate 137 and an oxide layer 138 and the portion of N region 116 underlying the oxide layer 138. The metal layer 137 is extended to make contact with P region 106 which is an emitter of the duojunction transistor section of device 200. A similar construction on N region 111 forms capacitor C–20 (hidden from view) with a metal layer extended to P region 106, the other emitter. The control of the phase for switching the duojunction transistor portion of the device 200 to produce a gate current sufficient to switch the control rectifier portion of device 200 may be provided by a pair of variable capacitor plates provided in close proximity to capacitor C–10 and capacitor C–20 which is formed similar to C–10 on N region 111 (hidden from view). This may be accomplished by the mounting arrangement for device 200. Also, electrical leads from capacitor C–10 and capacitor C–20 (not illustrated) could be coupled through a variable resistance external to the device 200, thus placing a variable impedance between emitters $E_1$ and $E_3$.

The operation of the semiconductor integrated circuit depicted in FIGURE 10 is identical to the one in FIGURE 9 with the exception of the slow switching controlled rectifier function.

The semiconductor integrated circuit depicted in FIGURE 10 is made by the exact same procedure as that described with reference to FIGURE 9 through the boron diffusion step to provide the P-plus region. After the P-plus diffusion, the oxide and any glaze were removed with HF. Using KMER and a suitable mask, the mesas and other regions requiring etching were subjected to an appropriate etchant to achieve the construction illustrated in FIGURE 10. The entire device was then oxidized in steam at 1200° centigrade for one hour. The etched areas of the device were filled with a non-reactive, inert filler for example epoxy or glass. Using a suitable mask aluminum was evaporated on to the surface to form the capacitor plates of the device. Using KMER and a suitable mask, the oxide was removed from regions requiring plating for ohmic contacts. The appropriate areas were plated to provide ohmic contacts, and then connections were made to the regions requiring such.

It will be appreciated that various minor modifications and changes to the structures and method of making the structures appertaining to the invention will be readily apparent to those skilled in the art. For example although silicon has been used as the illustrative semiconductor material, germanium and the compound semiconductors can be equally as well utilized in forming the various structures appertaining to the invention. Moreover, it will be appreciated that epitaxial growth techniques can be adapted to fabricating the devices of the invention. Therefore, it will be understood and appreciated that all such changes and modifications are within the scope of the invention as limited necessarily by the claims appended hereto.

What is claimed is:

1. A duojunction transistor comprising a semiconductor body of one-type conductivity having a region of opposite-type conductivity at each end thereof forming a PN junction therewith, a contact for each region shunting such region to the body along the PN junction, an area of opposite-type conductivity adjacent to each region penetrating a portion of said body between its end and forming PN junctions therewith, each area being within a diffusion length for minority carriers in said body from the region of its adjacency and beyond such diffusion length from each other, and electrical contacts to each said area.

2. A duojunction control switch comprising a semiconductor body of one-type conductivity having a region of opposite-type conductivity at each end thereof forming a PN junction therewith, a contact for each region shorting such region to the body along the PN junction, an area of opposite-type conductivity adjacent to each region penetrating a portion of said body between its ends and forming PN junctions therewith, each area being within a diffusion length for minority carriers in said body from the region of its adjacency and within such diffusion length from each other, and contacts to each said area.

3. A semiconductor device comprising a body of semiconductor material of one-type conductivity having four discrete regions of opposite-type conductivity spaced sequentially along substantially the entire length of said body and forming PN junction therewith, each region penetrating a portion of said body, and each of said four discrete regions being sequentially spaced apart within at least a diffusion length for minority carriers in said body, and an ohmic contact to each of said four regions.

4. The device of claim 3 having a field effect zone within a portion of said body between the inner pair of said four discrete regions.

5. A semiconductor device comprising a body of semiconductor material of one-type conductivity having four sequentially spaced apart regions of opposite-type conductivity positioned substantially along the entire length and penetrating a portion of said body forming PN junctions therewith, each of said four sequentially spaced regions being within at least a diffusion length for minority carriers in said body of the next region of sequentiality, the most remotely separated pair of regions of sequentiality having contacts shunting such region of said pair to said body along the PN junction therebetween, the other of said four sequentially spaced regions having ohmic contacts thereto.

6. A semiconductor device comprising a body of semiconductor material of one-type conductivity having four sequentially spaced regions of opposite-type conductivity positioned substantially along the entire length of said body and forming PN junctions therewith, the inner two of said four sequentially spaced regions each being within at least a diffusion length for minority carriers in said body of their respective outer region of adjacency, the two inner regions of sequentiality without at least a diffusion length for minority carriers in said body of each other, electrical contacts shunting each outer region of adjacency to said body along a PN junction, and electrical contacts to each inner region of sequentiality.

7. The device of claim 6 having a minority carrier neutralizer area within a portion of said body intermediate said two inner regions of sequentiality.

8. A semiconductor duojunction controlled switch comprising a body of semiconductor material of one-type conductivity having four distinct regions of opposite-type conductivity positioned sequentially along substantially the entire length of said body and penetrating a portion thereof, forming PN junctions therein, the outer distinct regions each having a contact shunting such region to said body along the PN junction therebetween, and each of said four distinct regions being within at least a diffusion length for minority carriers in said body of the next region of sequentiality, and non-rectifying contacts to the inner distinct regions.

9. A slow switching semiconductor control rectifier comprising an elongated semiconductor body having four sequentially contiguous elongated layers, alternate layers being of opposite-type conductivity and forming PN junctions therebetween, outer layers of said body defining a cathode and an anode the inner layer contiguous to one of the cathode layer and anode layer defining a gate layer, a gate electrode attached to one end extremity of said gate layer, a cathode contact to said cathode layer adjacent the other end extremity of said gate layer and an anode contact to said anode layer adjacent the other end extremity of said gate layer, said device, when anode blocking voltage is applied and gate current is supplied the central PN junction, initially undergoing break down in the vicinity of said gate electrode and thereafter gradually throughout the entire area of said central junction from the region adjacent said one end extremity to the region adjacent said other end extremity of the gate layer.

10. A duojunction transistor comprising a semiconductor body of one-type conductivity having a region of opposite-type conductivity at each end thereof forming a PN junction therewith, and an area in each region of like-type conductivity as said body forming a PN junction with said region, a contact to said body at each end thereof shunting each region to the area therein and to the body along the PN junctions, a zone of opposite-type conductivity adjacent each region and area therein penetrating a portion of said body between its ends and forming PN junctions therewith, each zone being within a diffusion length for minority carriers in said body from the region of its adjacency and beyond such diffusion length from each other, and a contact to each area.

11. The duojunction transistor of claim 10 having a minority carrier neutralizer portion in said body intermediate the zones of opposite-type conductivity.

12. A duojunction control switch comprising a semiconductor body of one-type conductivity having a region of opposite-type conductivity at each end thereof forming a PN junction therewith and an area in each region of like-type conductivity in said body forming a PN junction with said region, a contact to said body at each end thereof shunting each region to the area therein and to the body along the PN junctions, a zone of opposite-type conductivity adjacent to each region penetrating a portion of said body between its ends and forming PN junctions therewith, each zone being within a diffusion length for minority carriers in said body from the region of its adjacency and within such diffusion length from each other, and electrical contacts to each said zone.

13. A semiconductor device comprising a body of semiconductor material of one-type conductivity having four sequentially spaced apart regions of opposite-type conductivity positioned substantially along the entire length of said body and forming PN junctions therewith, each of said four sequentially spaced regions being within at least a diffusion length for minority carriers in said body of the next region of sequentiality, the most remotely separated pair of regions of sequentiality each having an area of like-type conductivity as said body forming a PN junction to such region, a contact shunting each region of said most remotely separated pair of regions to the area therein and to said body along the PN junctions, the other of said four sequentially spaced regions having electrical contacts thereto.

14. A semiconductor device comprising a semiconductor body of one-type conductivity having a region of opposite-type conductivity at each end thereof forming a PN junction therein, an area of said one-type conductivity in each region forming a PN junction with such regions, a layer of low resistivity material interconnecting each said region to the area therein and to said body along the PN junctions, each said layer having an electrical lead thereto, a zone of opposite-type conductivity than said body adjacent each said region interposing a portion of said body between its ends, each zone being within a diffusion length for minority carriers from said region of adjacency and beyond such diffusion length from each other, and electrical contacts to each said zone.

15. The device of claim 14 having a minority carrier neutralizer section in said body intermediate the zones of opposite-type conductivity.

16. A semiconductor device comprising a body of semiconductor material of one conductivity type having a pair of spaced apart regions of opposite-type conductivity forming PN junctions therewith, a contact for each region of said pair shunting each region to said body along the respective PN junction, two areas forming rectifying junctions to said body intermediate said pair of regions and separated by more than a diffusion length for minority carriers in said body, each area being within a diffusion length for minority carriers in said body to its respective nearest region and an electrode attached to each of said area.

17. A semiconductor duojunction controlled switch comprising a body of semiconductor material of one-type conductivity, having four distinct regions of opposite-type conductivity positioned sequentially along substantially the entire length of said body penetrating a portion thereof and forming PN junctions therewith, the outer distinct regions having an area therein of said one-type conductivity, a layer of low resistivity material interconnecting each such outer region to the area therein and to said body along the PN junctions, each said layer having an electrical lead thereto, and each of said four distinct regions being within at least a diffusion length for minority carriers in said body of the next region of sequentiality and electrical contacts to the inner distinct regions.

18. A semiconductor integrated network comprising a semiconductor body defining in one portion thereof a central region of one-type conductivity having an intermediate region of opposite-type conductivity than the central region on each side thereof forming PN junctions therewith and an outer region of like-type conductivity as the central region contiguous with each intermediate region forming PN junctions therewith, and a pair of contacts each shunting one said intermediate region to the contiguous outer region and defining in another portion an electrically relatively isolated elongated zone of like-conductivity as said central region, each end of said zone electrically contiguous with said one portion solely through one of the intermediate regions and forming PN junction boundaries therewith, an electrical conductor shunting each end of said zone to one of the intermediate regions along its respective PN junction boundary, a pair of discrete areas of said opposite-type conductivity within said elongated zone interposing a portion thereof forming PN junctions therewith, each discrete area spaced within a diffusion length for minority carriers in said zone of a different one of said intermediate regions and from each other by more than said diffusion length, each area having an electrical contact thereto.

19. The semiconductor integrated network of claim 18 having a minority carrier neutralizer section in said elongated zone between said pair of discrete areas.

20. A semiconductor integrated circuit comprising a semiconductor body defining in one portion thereof five successively contiguous layers, alternate layers being of opposite-type conductivity and forming PN junctions with contiguous layers, a contact shunting each outer layer to the intermediate layer contiguous therewith along at least part of the PN junction therebetween, and defining in the remaining portion thereof an isolated elongated region of like-type conductivity as the center layer in said one portion, each end of said region solely contiguous to said one portion through a different intermediate layer of said one portion, a pair of discrete areas of like-type conductivity as said intermediate layers within said elongated region interposing a part thereof and forming PN junctions therewith, each discrete area of said pair spaced within a diffusion length for minority carriers in said region of a different one of said intermediate layers and from each other by more than said diffusion length, an electrical contact shunting said elongated body to each said intermediate layer along the PN junction therebetween, and an electrical connection to each discrete area.

21. A semiconductor integrated circuit comprising a semiconductor body defining in one portion thereof a central region of one-type conductivity having an intermediate region of opposite-type conductivity than the central region on each side thereof forming PN junctions therewith and an outer region of like-type conductivity as the central region contiguous with each intermediate region forming PN junctions therewith, each intermediate region and contiguous outer region together forming substantially planer outer surfaces on the semiconductor body, and a contact to each outer planer surface shunting the intermediate region to the outer region; and defining in another portion an isolated elongated zone of like-conductivity type as said central region, each end of said zone solely contiguous with said one portion through one of the intermediate regions, a distinct portion of like-type conductivity as said outer region within a part of each said intermediate region discontiguous with said central and outer regions, a layer of low resistivity material interconnecting each such discontiguous part of the intermediate regions to one said distinct portion and to the end of said zone thereabout, a pair of discrete areas of said opposite-type conductivity within said zone interposing the ends thereof, each discrete area spaced within a diffusion length for minority carriers in said zone of a different one of said discontiguous parts and from each other by more than said diffusion length, each area having an electrical contact thereto.

22. The semiconductor integrated circuit of claim 21 having a minority carrier neutralizer section in said elongated zone between said pair of discrete areas.

23. A semiconductor integrated circuit comprising a semiconductor body defining in one portion thereof a central region of one-type conductivity having an intermediate region of opposite-type conductivity than the central region on each side thereof forming PN junctions therewith and an outer region of like-type conductivity as the central region contiguous with each intermediate region forming PN junctions therewith, each intermediate region and contiguous outer region together forming substantially a planer surface on said semiconductor body and defining a central boundary therebetween, a channel on each side of the central boundary along each planer surface, each said channel extending from its respective planer surface and at least into said central region and extending from an edge of said one portion intercepted by each said central boundary throughout a major part of said one portion along each said central boundary; and defining in the remaining portion an electrically relatively isolated elongated zone of like-type conductivity as said central region, each end of said zone electrically contiguous with said one portion solely through a juncture of one of the intermediate regions about the part thereof across the channel therethrough from the central boundary along such channel, and a pair of discrete areas of like-type conductivity as said intermediate regions within said zone, each discreet area spaced within a diffusion length for minority carriers in said zone from its respective nearest intermediate region and separated from each other by more than said diffusion length, low resistivity material shunting each said intermediate region to said zone along said juncture thereto, and an electrical contact to each discrete area.

24. A semiconductor integrated circuit comprising a semiconductor body defining in one portion thereof a central layer of one-type conductivity having an intermediate layer of opposite-type conductivity than the central layer on each side thereof forming PN junctions therewith and an outer layer of like-type conductivity as the central layer forming PN junctions therewith contiguous with each intermediate layer, and each intermediate layer and contigous outer layer together forming substantially a planar surface on said semiconductor body and defining a central boundary therebetween, a channel on each side of the central boundary along each planar surface, each said channel extending throughout said one portion between each planar surface and extending from an edge of said one portion throughout a major part of said one portion along each said central boundary; and defining in the remaining portion an electrically relatively isolated elongated zone of like-type conductivity as said central layer, each end of said zone electrically contiguous with said one portion solely through a juncture of one of the intermediate layers about the part thereof across the channel therethrough from the central boundary along such channel, and a pair of discrete areas of like-type conductivity as said intermediate layers within said zone, each discrete area spaced within a diffusion length for minority carriers in said zone of a different one of said junctures and separated from each other by more than said diffusion length, a low resistivity material shunting each said intermediate layer to said zone along said juncture thereto, and an electrical contact to each discrete area.

25. The semiconductor integrated circuit of claim 24 having a distinct portion of like-type conductivity as said outer layer within a sector of each intermediate layer and discontiguous with said central and outer layers, each distinct portion being shunted by said low resistivity material.

26. A semiconductor device comprising a semiconductor body of one-type conductivity having a region of opposite-type conductivity at each end thereof forming a PN junction therewith, a contact for each region shunting such region to the body along the PN junction, an area of opposite-type conductivity adjacent to each region penetrating a portion of said body between its ends and forming PN junctions therewith, each area being within a diffusion length for minority carriers in said body from the region of its adjacency, and electrical contacts to each said area.

27. The device of claim 26 defining a field effect region intermediate the areas of opposite-type conductivity.

28. The device of claim 27 wherein the field effect region includes a pair of spaced-apart sections of a conductivity type opposite said field effect region, and an ohmic contact shunting said pair of sections to said field effect region.

29. A semiconductor device comprising a semiconductor body of one-type conductivity having a region of opposite-type conductivity at each end thereof forming a PN junction therewith, a contact for each region shunting such region to the body along the PN junction, an area of opposite-type conductivity adjacent to each region penetrating a portion of said body between its ends and forming PN junctions therewith, each area being within a diffusion length for minority carriers in said body from the region of its adjacency, electrical contacts to each said area, a zone of opposite-type conductivity intermediate the ends of said body, said zone including two spaced-apart sections of like-type conductivity as said body, and an ohmic contact forming a common connection between each section and zone.

References Cited by the Examiner

UNITED STATES PATENTS

| | | | |
|---|---|---|---|
| 2,875,505 | 3/1959 | Pfann. | |
| 2,877,359 | 3/1959 | Ross | 307—88.5 |
| 3,038,085 | 6/1962 | Wallmark et al. | 307—88.5 |

References Cited by the Applicant

UNITED STATES PATENTS

| | | |
|---|---|---|
| 2,769,926 | 11/1956 | Lesk. |
| 3,123,750 | 3/1964 | Hutson et al. |
| 3,124,703 | 3/1964 | Sylvan. |

JOHN W. HUCKERT, *Primary Examiner.*

R. SANDLER, *Assistant Examiner.*